(12) United States Patent
Ishiura et al.

(10) Patent No.: US 7,541,722 B2
(45) Date of Patent: Jun. 2, 2009

(54) ELECTRONIC COMPONENT AND MANUFACTURING METHOD THEREOF

(75) Inventors: Yutaka Ishiura, Kyoto (JP); Takeshi Matsumae, Ishikawa-gun (JP); Kazuhiro Inoue, Ritto (JP); Toshiaki Takata, Ishikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/100,459

(22) Filed: Apr. 10, 2008

(65) Prior Publication Data

US 2008/0179991 A1 Jul. 31, 2008

Related U.S. Application Data

(63) Continuation of application No. PCT/JP2007/057163, filed on Mar. 30, 2007.

(30) Foreign Application Priority Data

Apr. 28, 2006 (JP) .............................. 2006-125606

(51) Int. Cl.
*H01L 41/047* (2006.01)
(52) U.S. Cl. ................... 310/366; 310/313 R; 310/365; 310/364; 310/363; 333/189
(58) Field of Classification Search ............. 310/313 R, 310/364–366
See application file for complete search history.

(56) References Cited

U.S. PATENT DOCUMENTS 6,476,536 B1 * 11/2002 Pensala ...................... 310/312
6,486,752 B1   11/2002 Noguchi
6,552,475 B2 *  4/2003 Hori et al. .................... 310/364
6,903,497 B2 *  6/2005 Uchiyama et al. ............ 310/365
7,112,913 B2 *  9/2006 Shimoe et al. .......... 310/313 R
2004/0189147 A1  9/2004 Ito et al.
2007/0013268 A1 * 1/2007 Kubo et al. .................. 310/324

FOREIGN PATENT DOCUMENTS

| JP | 2-180076 A | 7/1990 |
| JP | 10-233642 A | 9/1998 |
| JP | 2000-183680 A | 6/2000 |
| JP | 2001-358417 A | 12/2001 |

OTHER PUBLICATIONS

Official communication issued in counterpart International Application No. PCT/JP2007/057163, mailed on Jul. 17, 2007.

* cited by examiner

*Primary Examiner*—Jaydi SanMartin
(74) *Attorney, Agent, or Firm*—Keating & Bennett, LLP

(57) ABSTRACT

An electronic component has a structure which prevents corrosion caused by moisture intrusion through an electrode pattern extending inwardly from an edge connecting a side and one of main surfaces of a substrate and, therefore, deterioration of a characteristic rarely occurs over time. The electronic component includes, on the first main surface of the substrate, the first electrode pattern extending inwardly from an edge connecting the side of the substrate and the first main surface of the substrate, the second electrode pattern that is opposite to the end of the first electrode pattern through the gap, and the third electrode pattern that is disposed on the first electrode pattern and the second electrode pattern such that it covers the gap. The third electrode pattern is formed from a metal film that is highly resistant to corrosion, the corrosion resistance of which is superior to that of metal films forming the first electrode pattern and the second electrode pattern.

13 Claims, 8 Drawing Sheets

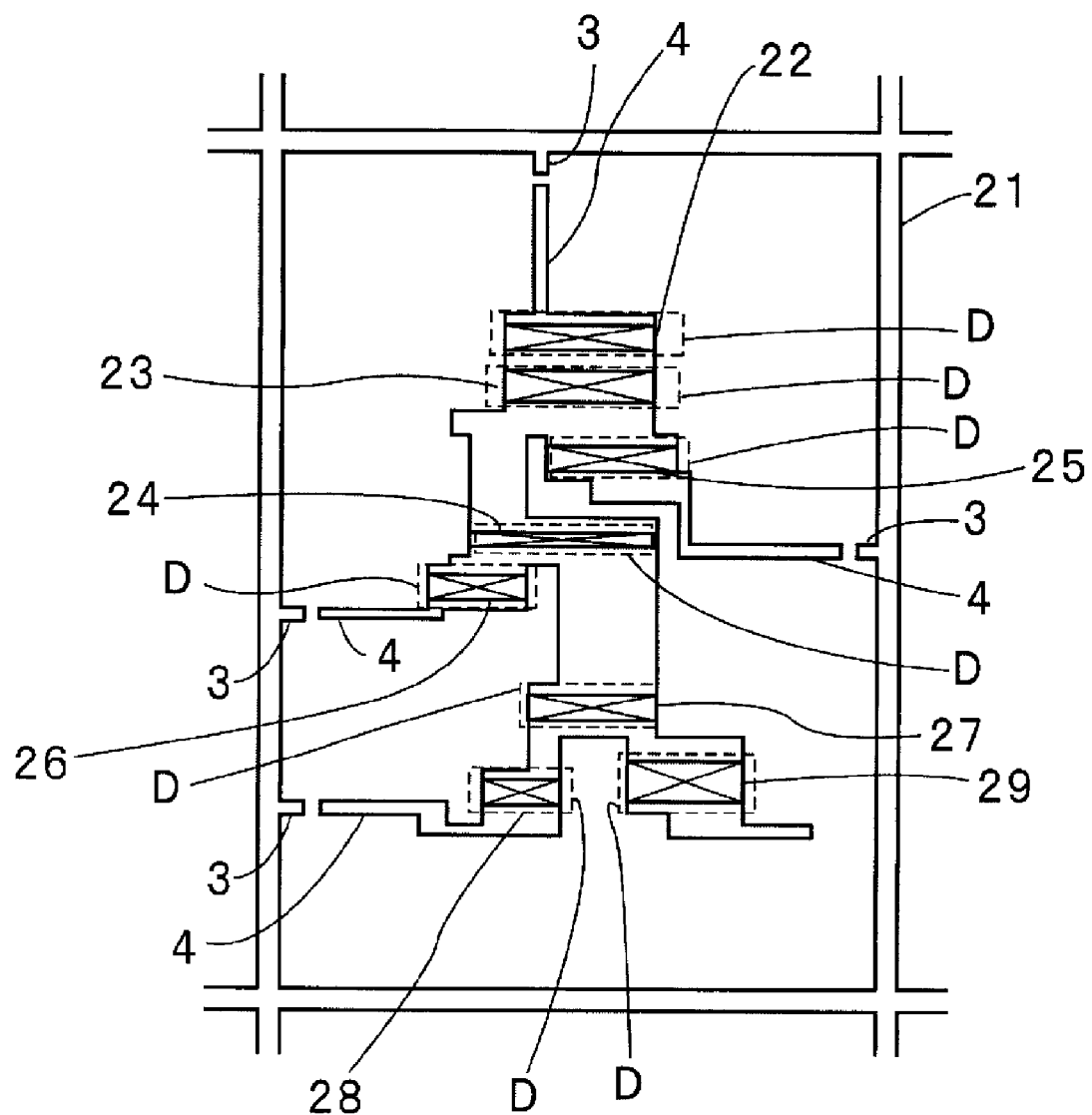

ELECTRONIC COMPONENT AND MANUFACTURING METHOD THEREOF

BACKGROUND OF THE INVENTION

1. Field of the Invention

The present invention relates to electronic components, such as surface acoustic wave devices and manufacturing methods thereof, and more particularly, to an electronic component having an improved configuration of an electrode pattern connected to an electronic component and a manufacturing method thereof.

2. Description of the Related Art

Recently, as a method of manufacturing many electronic components, such as surface acoustic wave filter devices, a method of preparing a wafer including a plurality of electronic components and dividing the wafer has been used. This method improves the mass productivity of electronic components.

When manufacturing electronic components, it is necessary to measure the characteristics of electronic components and determine whether the electronic components are non-defective components based on the measurement results. Alternatively, it is sometimes necessary to measure the characteristics of the electronic components for frequency adjustment performed at a subsequent stage. The measurement of characteristics of individual electronic components is complicated. It is therefore desirable to measure the characteristics of many electronic components before a wafer including these electronic components is divided. Japanese Unexamined Patent Application Publication No. 10-233642 discloses an example of a manufacturing method which enables the measurement of characteristics of many surface acoustic wave devices before a wafer including these surface acoustic wave devices is divided.

FIG. 11 is a schematic fragmentary plan view describing a manufacturing method disclosed in Japanese Unexamined Patent Application Publication No. 10-233642, that is, a method of measuring the characteristics of surface acoustic wave filter devices that are electronic components on a wafer. A lattice-like conductive pattern 502 is formed on a wafer 501. In a single rectangular region included in the lattice-like conductive pattern 502, an electrode configuration is provided so as to define a single surface acoustic wave device 503.

That is, on the wafer 501 defined by a piezoelectric substrate, the illustrated electrode configuration is provided in each of a plurality of rectangular regions included in the lattice-like conductive patterns 502, whereby a plurality of surface acoustic wave devices 503 are formed on the wafer 501.

As shown in FIG. 11, the surface acoustic wave device 503 is a ladder surface acoustic wave filter having a ladder circuit configuration in which a plurality of one-port SAW resonators 504 to 508 are electrically connected by conductive patterns. Among the one-port SAW resonators 504 to 508, the SAW resonators 504 and 508 which will eventually be connected to the ground potential are electrically connected to the lattice-like conductive pattern 502 using electrode patterns 509 and 510.

At the time of characteristic measurement, the input terminal of the surface acoustic wave device 503 is brought into contact with a hot probe and a ground probe, and the output terminal thereof is also brought into contact with the hot probe and the ground probe. In this case, the ground probe is brought into contact with the electrode pattern 509 on the side of the input terminal, and the ground probe is brought into contact with the electrode pattern 510 on the side of the output terminal. Subsequently, the characteristic measurement is performed.

To produce each of the plurality of surface acoustic wave devices 503, the wafer 501 is divided by cutting the wafer 501 along alternate long and short dash lines A and B after the above-described characteristic measurement has been performed.

In the manufacturing method disclosed in Japanese Unexamined Patent Application Publication No. 10-233642, at the time of manufacturing each of the plurality of surface acoustic wave devices 503, the wafer 501 is divided after the characteristic measurement has been performed. Accordingly, it can be easily determined whether each of the plurality of surface acoustic wave devices 503 is a non-defective component based on the measurement results. Furthermore, the mass productivity of the surface acoustic wave devices 503 is improved. In addition, in the measurement of a characteristic of each of the surface acoustic wave devices 503 formed on the wafer 501, a transmission characteristic that is almost the same as that of a finished product is obtained.

However, in a completed surface acoustic wave filter device, cut surfaces are provided along the alternate long and short dashed line A. In this case, the electrode patterns 509 and the 510 are partially cut, thereby being exposed on the cut surfaces.

Accordingly, moisture is likely to enter through the gaps between one side of the piezoelectric substrate that is the wafer and the cut surface of the electrode pattern 509 and between another side of the piezoelectric substrate and the cut surface of the electrode pattern 510. Electrode corrosion caused by moisture penetrates into the inside ends of the electrode patterns 509 and 510. In this case, an IDT included in a SAW resonator may corrode over time and the characteristic of the IDT may be deteriorated.

In particular, if the electrode patterns 509 and 510 or IDTs included in the surface acoustic wave device are made of an electrode material, such as Cu, that is susceptible to corrosion, corrosion is likely to occur over time.

In order to prevent such corrosion, a method of coating a cut line at the time of cutting of a wafer, that is, a dicing line, with a moisture-resistant resin may be used. However, even if the portions of the electrode patterns 509 and 510 to be cut are coated with the moisture-resistant resin, the cut surfaces of the electrode patterns 509 and 510 are exposed at the time of dicing. Accordingly, corrosion may occur over time. That is, if the above-described coating method is used, the time at which deterioration caused by corrosion occurs may be longer than the case in where the above-described coating method is not used. However, the characteristic deterioration may occur gradually over a long period of time.

The above-described corrosion occurs not only in surface acoustic wave devices, but also in various electronic components obtained by dividing a wafer including many electronic components. When the wafer is cut, an electrode pattern is exposed on the cut surface of the electronic component.

SUMMARY OF THE INVENTION

To overcome the problems described above, preferred embodiments of the present invention provide a reliable electronic component in which corrosion caused by moisture penetration through a portion between a substrate and an electrode pattern exposed at an edge connecting the main surface of the substrate and the side of the substrate is prevented and a manufacturing method thereof.

An electronic component according to a preferred embodiment of the present invention includes a substrate having a first main surface and a second main surface opposite to the first main surface, and a side connecting the first and second main surfaces, a first electrode pattern arranged to extend inwardly from an edge connecting the side and the first main surface of the substrate on the first main surface, a second electrode pattern arranged opposite to one end of the first electrode pattern through a gap having a predetermined width on the first main surface, and a third electrode pattern arranged to cover the end of the first electrode pattern on the side of the gap and one end of the second electrode pattern on the side of the gap and to cross the gap. The first, second, and third electrode patterns are defined by electrodes on the first main surface of the substrate. The third electrode pattern is made of a corrosion-resistant metal film, a corrosion resistance of which is superior to that of metal films used for the first and second electrode patterns.

In an electronic component according to this preferred embodiment of the present invention, the end of the first electrode pattern on the side of the gap is preferably opposite to the end of the second electrode pattern on the side of the gap through the gap, and the third electrode pattern is substantially straight. In this case, corrosion caused by moisture penetration is prevented with greater certainty.

The end of the second electrode pattern on the side of the gap is preferably out of alignment with an extension line of the first electrode pattern. The third electrode pattern preferably includes an electrode pattern portion located on an extension line of the first electrode pattern and a corner portion that is obtained by bending the third electrode pattern such that the third electrode pattern extends from the electrode pattern portion toward the second electrode pattern. In this case, as compared to a case in which the third electrode pattern is substantially straight, the corrosion caused by moisture penetration is prevented with greater certainty. The third electrode pattern preferably has a crank shape which includes a first electrode pattern portion located on an extension line of the first electrode pattern, a second electrode pattern portion located on an extension line of the second electrode pattern that is substantially parallel to and offset from the extension line of the first electrode pattern, and an intermediate portion connecting ends of the first and second electrode pattern portions and extending substantially perpendicular to the first and second electrode pattern portions. If the third electrode pattern has a crank shape, the corrosion caused by moisture penetration is prevented with greater certainty.

The third electrode pattern may be bent into any shape at a point on the extension line of the first electrode pattern. However, the third electrode pattern is preferably bent into a shape that includes a first straight portion, a second straight portion, and a third straight portion. The second straight portion is connected to one end of the first straight portion and extends at an angle of approximately 90° with respect to the first straight portion. The third straight portion is connected to one end of the second straight portion which is opposite to the other end of the second straight portion connected to the first straight portion and extends substantially in parallel with the first straight portion. In this case, the corrosion caused by moisture penetration is prevented with greater certainty.

In an electronic component according to preferred embodiments of the present invention and an electronic component manufacturing method according to preferred embodiments of the present invention, the above-described electronic component is not limited to a particular component. However, the present invention can preferably be used for a surface acoustic wave device. Consequently, a surface acoustic wave device in which the corrosion rarely occurs, and thus, the deterioration of a characteristic rarely occurs over time is obtained.

In another preferred embodiment of the present invention, the substrate is a piezoelectric substrate and includes a ground pad disposed thereon which is connected to the second electrode pattern and an IDT connected to the ground pad, in addition to the first to third electrode patterns, so as to define a surface acoustic wave device. In this case, a reliable surface acoustic wave device is obtained.

In an electronic component according to preferred embodiments of the present invention, the first and second electrode patterns each preferably includes a single electrode layer made of a material selected from the group consisting of Cu, Ag, and an alloy of Cu and Ag as a main electrode layer. The materials of Cu, Ag, or the alloy of Cu and Ag have high conductivity. Accordingly, the first and second electrode patterns having high conductivity are provided.

On the other hand, the third electrode pattern preferably includes an electrode layer made of Al or an Al alloy as a main electrode layer. In this case, the material of Al or the Al alloy is highly resistant to corrosion. Accordingly, the corrosion is more effectively prevented in a portion on the inner side of the third electrode pattern.

An electronic component manufacturing method according to a preferred embodiment of the present invention includes the steps of preparing a wafer including a mother substrate and an electrode arrangement that is formed on one of main surfaces of the mother substrate to form a plurality of electronic components according to preferred embodiments of the present invention, and obtaining individual electronic components by cutting the wafer such that, in each of the plurality of electronic components included in the wafer, cutting is performed at an intermediate portion of the first electrode pattern, and the first electrode pattern is extended to an edge that is obtained by the cutting and connects the first main surface and the side of the substrate.

In an electronic component manufacturing method according to another preferred embodiment of the present invention, a lattice-like electrode pattern is formed on the wafer, a single electronic component is formed in each of regions included in the lattice-like electrode pattern, the first electrode pattern is connected to the lattice-like electrode pattern, and the wafer is cut such that cutting is performed at the intermediate portion of the first electrode pattern in each of the regions included in the lattice-like electrode pattern. In this case, the first electrode patterns included in each of the regions are electrically connected using the lattice-like electrode pattern. Accordingly, by electrically connecting a portion connected to the ground potential to the first electrode patterns in each electronic component and bringing a probe into contact with the portion connected to the ground potential, the measurement of a characteristic can be easily performed before cutting of the wafer. Furthermore, even if the intermediate portions of the first electrode patterns are cut at the time of cutting of the wafer, the corrosion is prevented by the third electrode patterns in each electronic component. Accordingly, the reliability of each electronic component is significantly increased. Thus, many electronic components can be effectively obtained by cutting a wafer including these electronic components.

In an electronic component manufacturing method according to another preferred embodiment of the present invention, a plurality of IDTs and a plurality of ground pads are formed as electrodes, and each of the plurality of ground pads is electrically connected to the second electrode pattern in each of the regions included in the lattice-like electrode pattern.

In an electronic component according to preferred embodiments of the present invention, the first electrode pattern extends inwardly from the edge connecting the first main surface and the side of the substrate on the first main surface, one end of the first electrode pattern is opposite to the second electrode pattern through the predetermined gap on the first main surface, and the third electrode pattern, which is made of a metal film that is highly resistant to corrosion, is formed on the first and second electrode patterns such that it covers a portion in which the first and second electrode patterns are opposite each other through a gap. Accordingly, even if corrosion occurs in the first electrode pattern, the corrosion is prevented by the third electrode pattern. As a result, the second electrode pattern disposed on the inner side of the third electrode pattern is rarely corroded. Thus, a reliable electronic component in which a characteristic is not substantially deteriorated over time is obtained.

According to a manufacturing method according to preferred embodiments of the present invention, after a wafer including many electronic components including the first, second, and third electrode patterns has been prepared, the wafer is cut such that cutting is performed at an intermediate portion of the first electrode pattern in each of the electronic components.

Consequently, many electronic components can be individually obtained. In each of the obtained electronic components, the third electrode pattern is formed on the inner side of the first electrode pattern such that it covers a portion at which the first and second electrode patterns are opposite each other through the gap therebetween. Accordingly, even if corrosion occurs in the first electrode pattern, the corrosion is suppressed in a portion in which the third electrode pattern is formed. The second electrode pattern disposed on the inner side of the first electrode pattern is therefore prevented from being corroded. Thus, a reliable electronic component in which a characteristic is not substantially deteriorated over time is obtained.

Other features, elements, steps, characteristics and advantages of the present invention will become more apparent from the following detailed description of preferred embodiments of the present invention with reference to the attached drawings.

BRIEF DESCRIPTION OF DRAWINGS

FIG. 4 is a schematic partial enlarged plan view showing an electrode configuration obtained in a step subsequent to a step shown in FIG. 2E in a manufacturing method according to the second preferred embodiment of the present invention.

DETAILED DESCRIPTION OF PREFERRED EMBODIMENTS

Preferred embodiments of the present invention will be described in detail below with reference to the accompanying drawings.

Figure 1A:
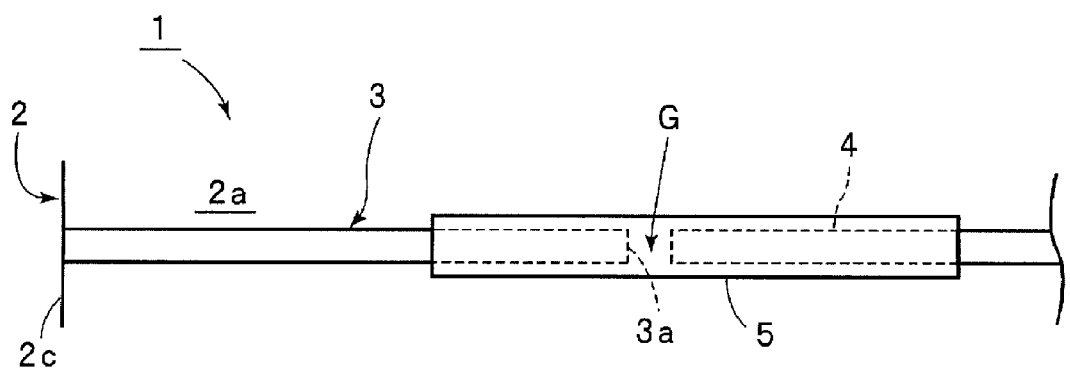
FIG. 1A is a schematic partially-broken plan view showing a main portion of an electrode configuration of an electronic component according to a first preferred embodiment of the present invention.
Figure 1B:
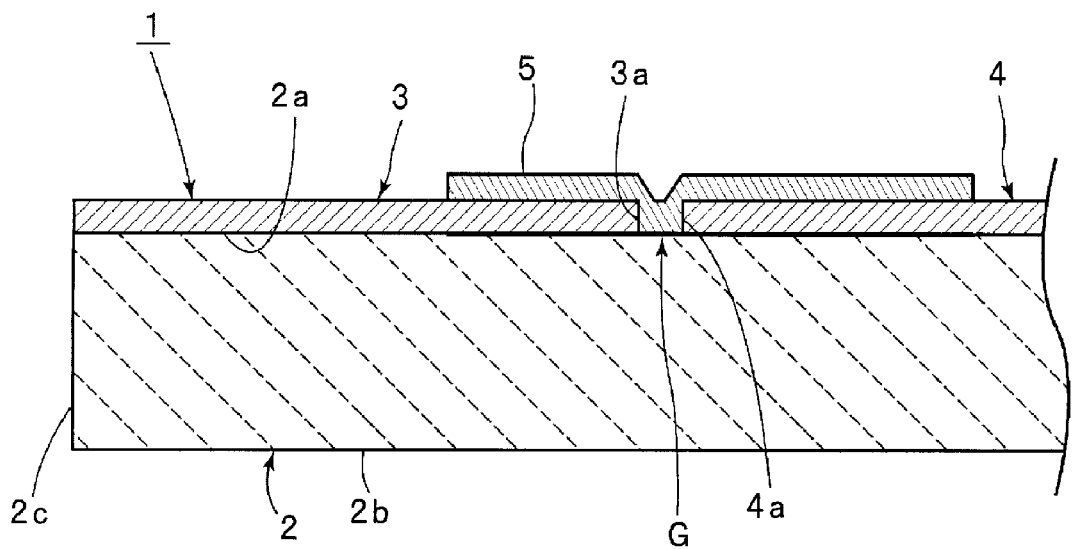
FIG. 1B is a partially-broken elevation cross-sectional view showing a main portion of an electrode configuration of an electronic component according to the first preferred embodiment of the present invention.

FIGS. 1A and 1B are schematic partially-broken plan view and a schematic partially-broken elevation cross-sectional view, showing a phenomenon in which the spread of corrosion via an electrode is prevented in an electronic component according to a first preferred embodiment of the present invention.

In this preferred embodiment, an electronic component 1 includes a substrate 2 including a first main surface 2a and a second main surface 2b opposite to the first main surface 2a and a side 2c connecting the first and second main surfaces.

On the first main surface 2a of the substrate 2, an electrode illustrated in FIG. 1A is provided. That is, a first electrode pattern 3, which functions as an electrode, extends inwardly from an edge connecting the side 2c and the first main surface 2a on the first main surface 2a. A second electrode pattern 4 is arranged such that it faces one end 3a of the first electrode pattern 3 on the first main surface 2a with a predetermined gap G provided therebetween. A third electrode pattern 5 is disposed on the first electrode pattern 3 and the second electrode pattern 4 such that it covers a portion at which the first electrode pattern 3 and the second electrode pattern 4 are opposed to each other.

The third electrode pattern 5 is made of a corrosion-resistant metal film, the corrosion resistance of which is superior to that of metal films from which the first and second electrode patterns are made.

In FIG. 1, portions in which the first electrode pattern 3, the second electrode pattern 4, and the third electrode pattern 5 are provided are schematically shown near the side 2c of the substrate 2 in the electronic component 1. However, on the substrate 2 of the electronic component 1, various electronic components required for the function of an electronic component are connected to the second electrode pattern 4. These electronic components are not limited to particular components, but are, for example, various electrodes such as an IDT and a capacitive electrode, or a resistor, a piezoelectric substance, and a dielectric which are configured to be electrically connected to the second electrode pattern 4.

In the electronic component 1, the corrosion resistance of the third electrode pattern 5 is superior to that of the first electrode pattern 3 and the second electrode pattern 4. Such a metal film having a high corrosion resistance is not limited to a particular film, and may be, for example, an Al or Au film. An Al film is inexpensive and has a high moisture resistance and a high corrosion resistance. Therefore, an Al film is preferably used. The third electrode pattern 5 may not be defined by a single metal film, and may be defined by a stacked metal film including an Al metal film having a high corrosion resistance as a main electrode layer, or may be defined by an Al alloy.

The first electrode pattern 3 and the second electrode pattern 4 have a corrosion resistance that is inferior to that of the third electrode pattern 5. The first electrode pattern 3 and the second electrode pattern 4 may be made of any appropriate metal material having high conductivity, such as Cu, Ag, or an alloy of Cu and Ag. The first electrode pattern 3 and the second electrode pattern 4 may be defined by a single metal film or a stacked metal film as long as they have an electrode layer made of Cu, Ag, or an alloy of Cu and Ag.

In the electronic component 1 according to this preferred embodiment, the first electrode pattern 3 is exposed at an edge connecting the side 2c and the first main surface 2a. Such an arrangement is usually obtained by dicing a wafer into a plurality of electronic components 1 during mass production of the electronic components 1. The side 2c is a surface that is exposed after dicing of a wafer. In this case, moisture may enter through a boundary surface between the first electrode pattern 3 and the side 2c. However, even if moisture enters along the first electrode pattern 3 and the spread of corrosion occurs, the spread of corrosion is stopped at the end 3a of the first electrode pattern 3.

That is, since the third electrode pattern 5 has a high corrosion resistance, the spread of corrosion is stopped at the end 3a and a portion on the inner side of the end 3a is not easily corroded.

That is, the second electrode pattern 4 is not easily corroded. Accordingly, in the electronic component 1, internal corrosion rarely occurs, and therefore, the characteristic deterioration is prevented.

In preferred embodiments of the present invention, as previously described, an electrode extends inwardly from the edge connecting the side 2c and the first main surface 2a of the substrate 2, and the characteristic deterioration caused by the spread of corrosion via the electrode is prevented. Electronic components used in preferred embodiments of the present invention are not limited to particular components. However, electronic components according to a second preferred embodiment used in a surface acoustic wave device and a manufacturing method thereof will be described with reference to FIGS. 2A to 8.

In the second preferred embodiment, a wafer configured to form a plurality of surface acoustic wave devices thereon is prepared. The manufacturing method of such a wafer will be described with reference to FIGS. 2A to 2G and FIGS. 3A to 5.

Figure 2A:
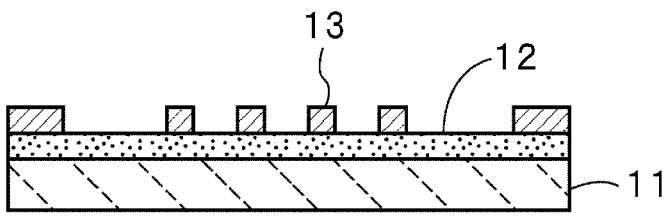
FIGS. 2A to 2G are schematic elevational cross-sectional views showing steps of manufacturing a surface acoustic wave device as an electronic component according to a second preferred embodiment of the present invention.

As shown in FIG. 2A, a mother substrate 11, which is made of a piezoelectric single crystal, such as $LiTaO_3$ or piezoelectric ceramics, is prepared. An $SiO_2$ film 12 is formed on the entire surface of the mother substrate 11 by sputtering. Subsequently, a negative photoresist layer is formed on the entire surface of the $SiO_2$ film 12, and is then exposed to light, whereby a photoresist pattern 13 is formed. The photoresist pattern 13 is provided in a region in which an electrode configuration to be described later will not be formed.

Figure 2B:
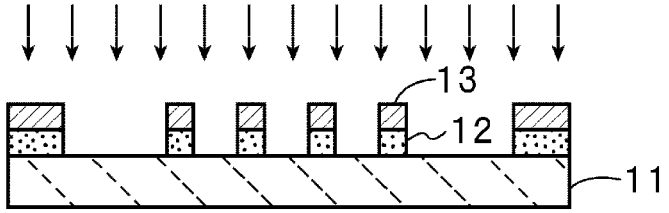

Subsequently, as shown in FIG. 2B using arrows, etching is performed on the $SiO_2$ film 12 using an etchant. Here, an etchant, such as $Cl_2$ or $CF_4$, that only dissolves the $SiO_2$ film 12 without dissolving the photoresist pattern 13 is preferably used. Accordingly, as shown in FIG. 2B, the $SiO_2$ film 12 is removed in the region in which the electrode configuration will be formed.

Figure 2C:
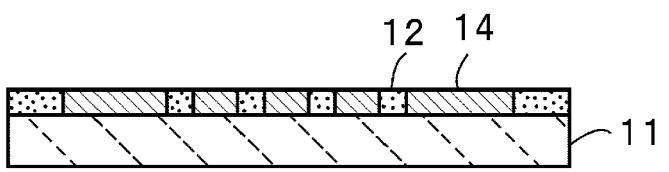

Subsequently, a Cu film is formed using a thin film coating method, such as sputtering or evaporation. After that, the photoresist pattern 13 and the Cu film formed on the photoresist pattern 13 are removed by performing a liftoff method using a solvent, such as acetone. Consequently, a Cu film 14 is formed in the electrode formation region as shown in FIG. 2C.

Figure 3A:
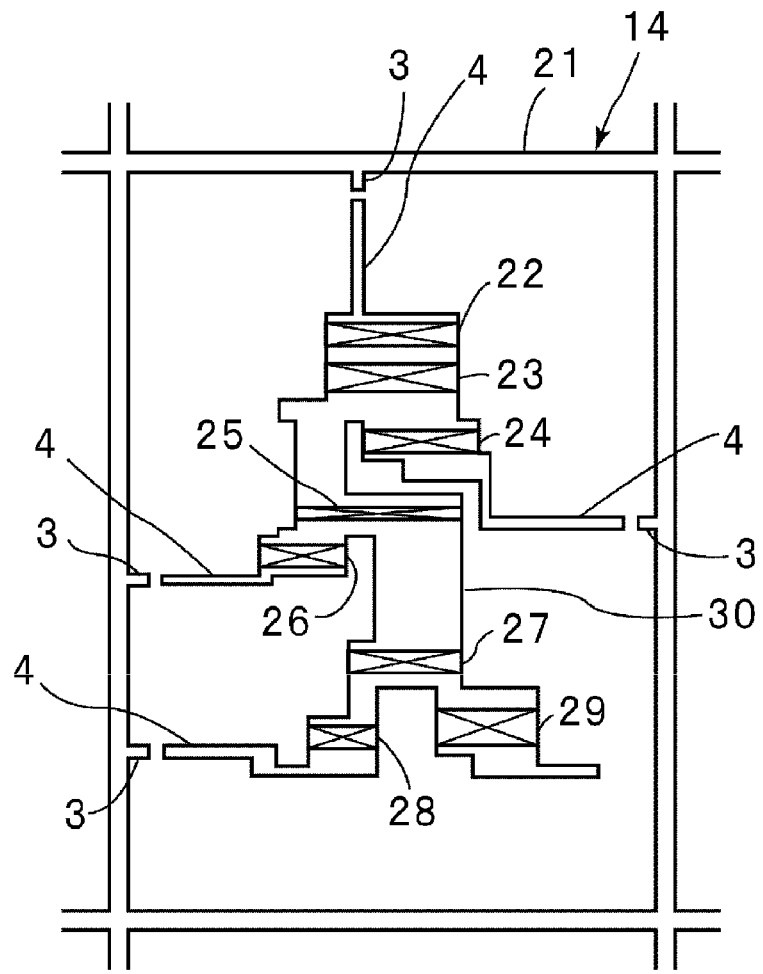
FIG. 3A is a schematic partial enlarged plan view showing an electrode configuration formed on the upper surface of a mother substrate in a step shown in FIG. 2C.

FIG. 3A is a schematic fragmentary plan view showing an electrode configuration including the Cu film 14. As shown in FIG. 3A, a lattice-like electrode pattern 21 is formed. In each region included in the lattice-like electrode pattern 21, the electrode configuration shown in FIG. 3A is formed. That is, in a single, substantially rectangular region included in the lattice-like electrode pattern 21, a single surface acoustic wave device is formed. FIG. 3A shows only a region in which a single surface acoustic wave device is formed. However, in reality, a plurality of regions in each of which a single surface acoustic wave device is formed are arranged in a matrix arrangement.

Figure 3B:
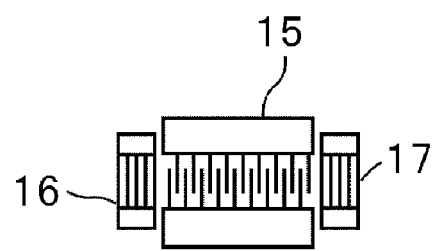
FIG. 3B is a schematic plan view showing the electrode configuration of a one-port SAW resonator.

In each of the substantially rectangular regions included in the lattice-like electrode pattern 21, an electrode film used to form the first electrode pattern 3, the second electrode pattern 4, and one-port SAW resonators 22 to 29 and the Cu film 14 used to form an electrode pattern 30 arranged to connect the one-port SAW resonators 22 to 29 with each other are formed. Each of the one-port SAW resonators 22 to 29 has an electrode configuration shown in FIG. 3B, that is, each of the one-port SAW resonators 22 to 29 includes an IDT 15 and reflectors 16 and 17 that are disposed on either side of the IDT 15 in a surface wave propagation direction as shown in FIG. 3B.

FIG. 3A schematically shows locations at which the one-port SAW resonators 22 to 29 are disposed using symbols obtained by placing a cross in a substantially rectangular frame so as to simplify the configuration including the IDT and the reflectors. In reality, however, each of the one-port SAW resonators 22 to 29 includes the IDT 15 and the reflectors 16 and 17 as shown in FIG. 3B. In this preferred embodiment, the one-port SAW resonators 22 to 29 are formed so as to achieve a ladder filter 18 illustrated in FIG. 6.

FIG. 3A shows a state in which the above-described electrode configuration is formed using the Cu film 14 in the region outside the region in which the $SiO_2$ film 12 is formed as shown in FIG. 2C.

Figure 2D:
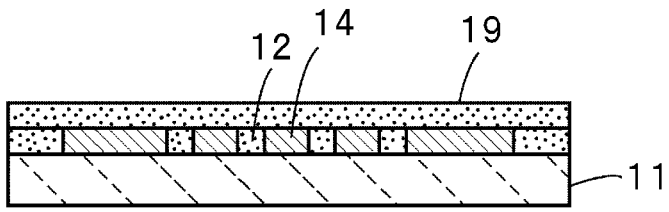
Figure 2E:
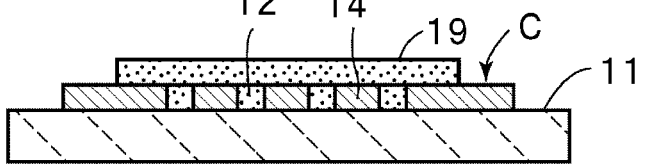

Subsequently, as shown in FIG. 2D, a protection film 19 made of $SiO_2$ is formed so as to cover the Cu film 14 and the $SiO_2$ film 12. After that, as shown in FIG. 2E, a portion of the protection film 19 and a portion of the $SiO_2$ film 12 under the protection film 19 are removed by etching. In this case, a portion of the protection film 19 is removed such that the protection film 19 remains on a main portion including the one-port SAW resonators 22 to 29, that is, a region in which electrode fingers are crossed is covered with the protection film 19, and the Cu film 14 is exposed in an electrode pad used for an electrical connection to an external portion or an electrical connection portion.

In FIG. 2E, a portion indicated by an arrow C corresponds to an electrode pad electrically connected to an external portion.

FIG. 4 is a schematic plan view showing a state in which the protection film 19 is partially removed as shown in FIG. 2E. Here, in regions surrounded by broken lines D, the protection film 19 remains. In the other regions, the protection film 19 is removed. That is, the protection film 19 remains in main portions in which the one-port SAW resonators 22 to 29 are formed, and the protection film 19 is removed in the other portion.

In FIG. 4, the protection film 19 made of SiO$_2$ is not shown, and only the portions in which the protection film 19 remains are shown by surrounding the portions with the broken lines.

Figure 2F:
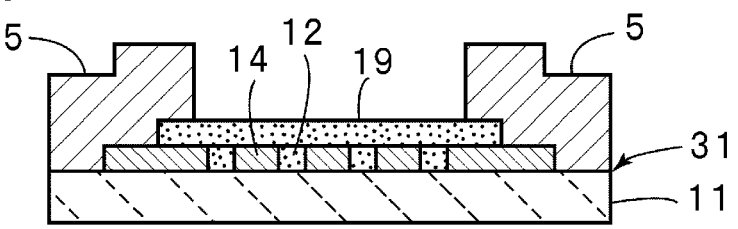

Subsequently, as shown in FIG. 2F, the third electrode pattern 5 is formed. The third electrode pattern 5 includes an Al electrode layer as a main electrode layer, and is formed by sputtering or evaporation in this preferred embodiment. The patterning of the third electrode pattern 5 is performed using a well-known photolithographic etching method. Here, a region in which the third electrode pattern 5 is formed is shown in a schematic plan view in FIG. 5.

That is, the third electrode pattern 5 is formed on the first electrode pattern 3 and the second electrode pattern 4, which are shown in FIG. 3A, such that it covers the gap between the first electrode pattern 3 and the second electrode pattern 4.

Figure 2G:
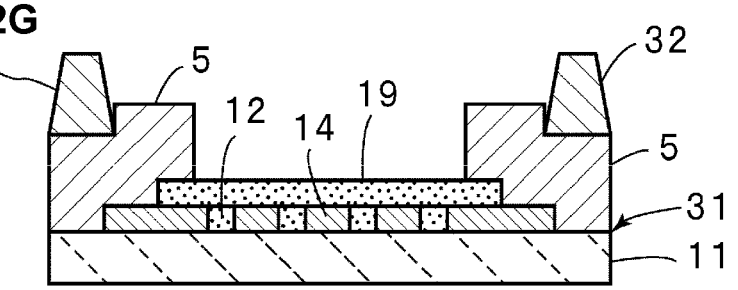
Figure 5:
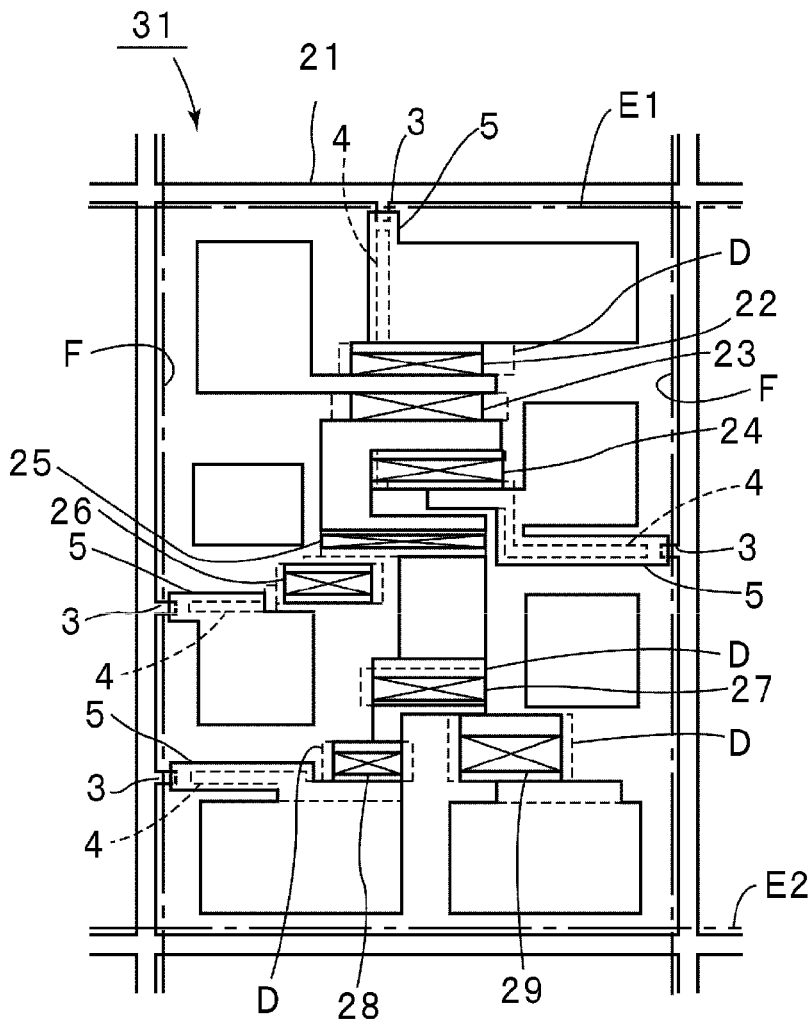
FIG. 5 is a schematic partial enlarged plan view showing an electrode configuration obtained in a step subsequent to a step illustrated in FIG. 2F in a manufacturing method according to the second preferred embodiment of the present invention.
Figure 6:
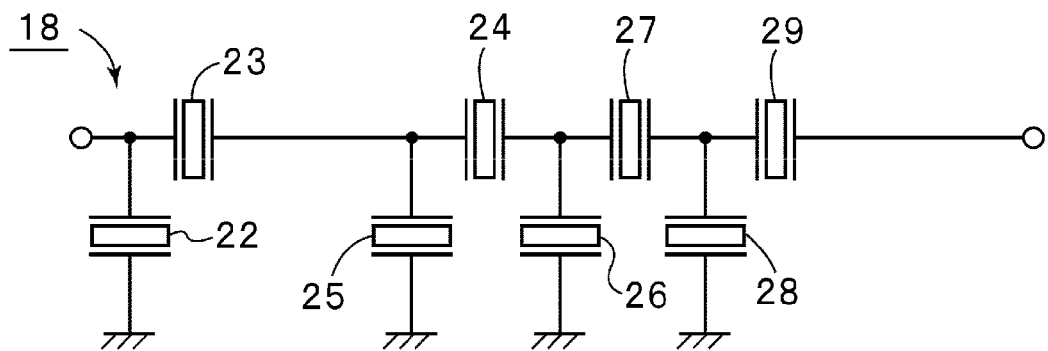
FIG. 6 is a circuit diagram showing a circuit configuration of a ladder filter of a surface acoustic wave device according to the second preferred embodiment of the present invention.

As shown in FIG. 5, the lattice-like electrode pattern 21 is connected to one end of the first electrode pattern 3. The first electrode pattern 3 extends from the lattice-like electrode pattern 21 in one of the substantially rectangular regions included in the lattice-like electrode pattern 21. The inside end 3a of the first electrode pattern 3 is disposed opposite to the second electrode pattern 4 through a gap therebetween. Thus, a wafer 31 shown in FIGS. 2F and 5 is obtained. Subsequently, in the wafer 31, as shown in FIG. 2G, a metal bump 32 made of Au is formed on a portion of the third electrode pattern 5. The metal bump 32 provides an electrical connection between a surface acoustic wave device and an external portion.

In various preferred embodiments of the present invention, however, the metal bump 32 may not be formed.

Subsequently, the wafer 31 is diced into individual surface acoustic wave device units. The dicing is performed by cutting the wafer 31 along alternate long and short dash lines E1, E2, and F shown in FIG. 5. That is, the dicing is performed in the intermediate portion of the first electrode pattern 3, and, more precisely, in a portion that is connected to the lattice-like electrode pattern 21 and is not covered with the third electrode pattern 5. Accordingly, on the side of a surface acoustic wave device obtained by the above-described dicing, the first electrode pattern 3 is partially exposed externally as shown in FIG. 1. Even if moisture enters from the exposed portion of the first electrode pattern 3 and the corrosion spreads over time due to moisture, the second electrode pattern 4 is not corroded, because the end 3a of the first electrode pattern 3 is disposed opposite to the second electrode pattern 4 through the gap therebetween and the third electrode pattern 5 is formed from a metal film having a high corrosion resistance. Accordingly, a reliable surface acoustic wave device in which characteristic deterioration caused by corrosion does not occur over time is provided.

It is desirable in the above-described dicing that the removal of the lattice-like electrode pattern 21 and the cutting along the alternate long and short dash lines E1, E2, and F be performed at the same time using a blade having a width greater than that of the lattice-like electrode pattern 21.

A humidity test is performed on a surface acoustic wave device according to a preferred embodiment and a surface acoustic wave device in the related art which has substantially the same configuration as that of the surface acoustic wave device according to a preferred embodiment of the present invention, except that the first electrode pattern 3 and the second electrode pattern 4 are not arranged opposite to each other through a gap therebetween and are integrated into a Cu film.

In the humidity test, the width of the first electrode pattern 3 that extends inwardly from the side of a surface acoustic wave device was set to about 10 μm, the length of a portion of the first electrode pattern 3 which was covered with the third electrode pattern was set to about 50 μm, the gap between the inside end 3a of the first electrode pattern 3 and the second electrode pattern 4 was set to about 30 μm, and the length of the exposed portion of the first electrode pattern, that is, the distance from the side of the substrate of the surface acoustic wave device to the portion of the first electrode pattern which is covered with the third electrode pattern 5, was set to about 70 μm. The humidity test was performed under the condition in which a surface acoustic wave device was subjected to a temperature of about 85° C. and a relative humidity of about 85% for about 100 hours.

Figure 7:
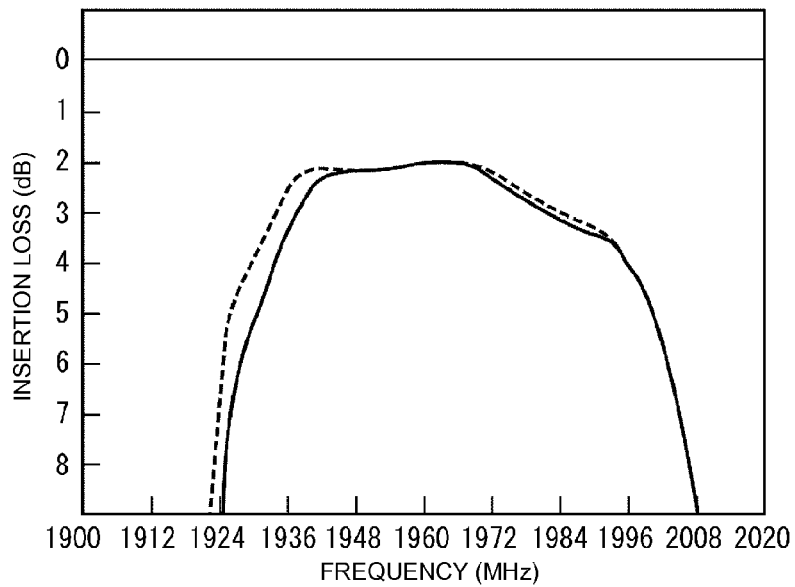
FIG. 7 is a diagram showing frequency characteristics obtained before and after a humidity test in a surface acoustic wave device in the related art.

FIG. 7 is a diagram showing frequency characteristics obtained before and after the humidity test in a surface acoustic wave device in the related art. Referring to FIG. 7, a broken line denotes a frequency characteristic obtained before the humidity test and a solid line denotes a frequency characteristic obtained after the humidity test.

Figure 8:
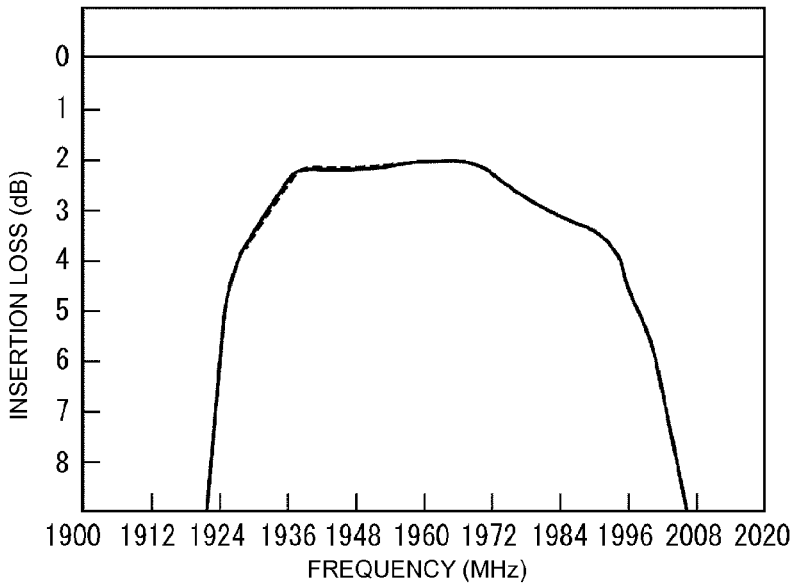
FIG. 8 is a diagram showing frequency characteristics obtained before and after a humidity test in a surface acoustic wave device according to the second preferred embodiment of the present invention.

FIG. 8 is a diagram showing frequency characteristics obtained before and after the humidity test in a surface acoustic wave device according to the above-described preferred embodiment of the present invention. Referring to FIG. 8, a broken line denotes a frequency characteristic obtained before the humidity test and a solid line denotes a frequency characteristic obtained after the humidity test.

As shown in FIG. 7, in a surface acoustic wave device in the related art, a frequency characteristic was changed in the vicinity of a frequency end portion of a pass band after the humidity test and the width of the pass band was reduced. It is assumed that the characteristic of a parallel arm resonator disposed near a ground line was deteriorated due to corrosion. On the other hand, as shown in FIG. 8, in a surface acoustic wave device according to the above-described preferred embodiment, almost no change in the frequency characteristic occurs before and after the humidity test.

Figure 9:
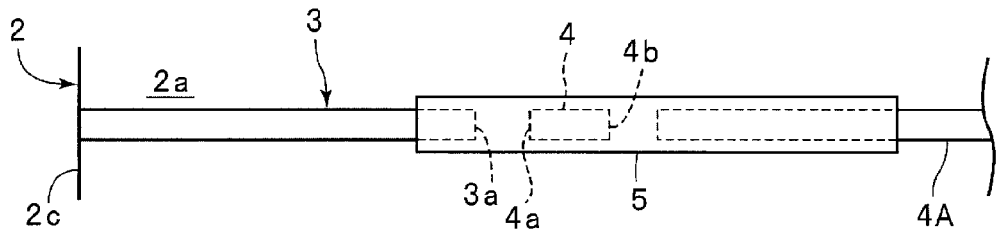
FIG. 9 is a schematic partially-broken plan view showing a modification of an electronic component according to the first preferred embodiment of the present invention.

In the above-described preferred embodiment, the inside end 3a of the first electrode pattern 3 and the second electrode pattern 4 are arranged opposite to each other through a single gap. According to preferred embodiments of the present invention, however, a second gap and a third gap may be further provided. FIG. 9 is a schematic plan view showing such a modification, and corresponds to FIG. 1A. Here, the first electrode pattern 3 extends inwardly from the side 2c of the substrate 2 on the first main surface 2a of the substrate 2. The second electrode pattern 4 is arranged such that it is opposite to the inside end 3a of the first electrode pattern 3 through a gap therebetween. The third electrode pattern 5 is formed on the first electrode pattern 3 and the second electrode pattern 4 such that it covers the gap through which the first electrode pattern 3 and the second electrode pattern 4 are opposite to each other.

The above-described configuration according to this modification is preferably the same as that according to the first preferred embodiment. In this modification, the second electrode pattern 4 further includes an inside end 4b that is opposite to an end 4a on the side of the first electrode pattern 3. The second electrode pattern 4 is opposite to a second electrode pattern 4A through a second gap therebetween. The third electrode pattern 5 is formed on the first electrode pattern 3, the second electrode pattern 4, and the second electrode pattern 4A such that it covers not only the gap between the first electrode pattern 3 and the second electrode pattern 4, but also the gap between the second electrode pattern 4 and the second electrode pattern 4A. The second electrode pattern 4A is made of the same material, such as a Cu film, used for the first electrode pattern 3 and the second electrode pattern 4.

Thus, a plurality of second electrode patterns 4 and 4A may be disposed on the inner side of the first electrode pattern 3 through a plurality of gaps. In this case, even if corrosion occurs in a portion on the side of the first electrode pattern 3, the spread of corrosion is effectively prevented and the inner side of the substrate 2 is prevented from being corroded.

Figure 10A:
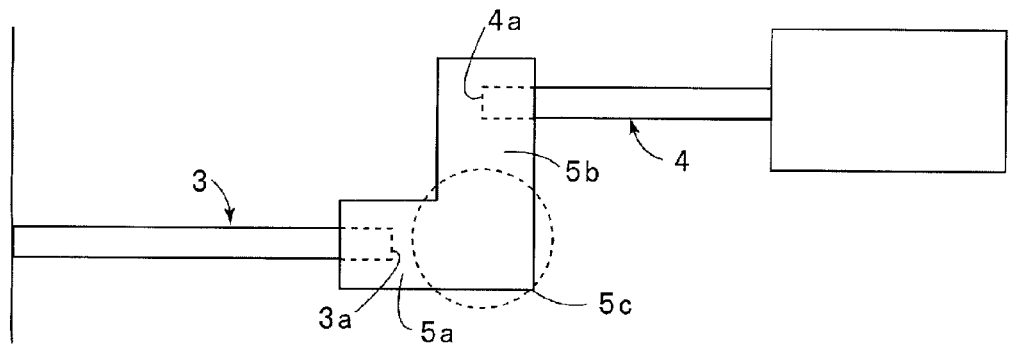
FIGS. 10A to 10C are schematic partially-broken plan views showing an example of the shape of a third electrode pattern according to a modification of the first preferred embodiment of the present invention.
Figure 10B:
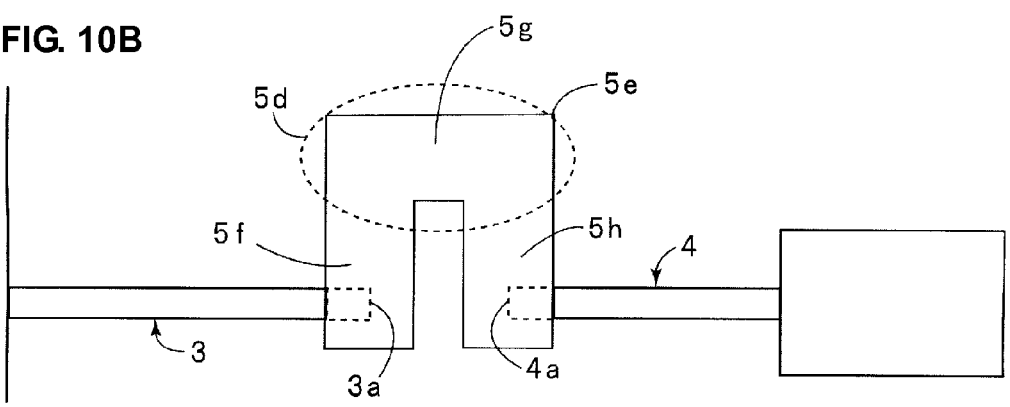

FIGS. 10A and 10B are schematic partially-broken plan views showing another modification of an electronic component according to the first preferred embodiment. In the modification shown in FIG. 10A, the end 3a of the first electrode pattern 3 is out of alignment with the end 4a of the second electrode pattern 4. That is, the end 4a of the second electrode pattern 4 is not on an extension line of the first electrode pattern 3. In this case, the third electrode pattern 5 includes an electrode pattern portion 5a located on an extension line of the first electrode pattern 3, a second electrode pattern portion 5b extending from an end opposite the first electrode pattern 4 in a direction in which the electrode pattern portion 5a and the second electrode pattern portion 5b intersects with each other, and a corner portion 5c that is a portion connecting the electrode pattern portion 5a and the second electrode pattern portion 5b. In this case, since the third electrode pattern 5 includes the corner portion 5c, the spread of corrosion caused by moisture intrusion is prevented with certainty.

The shape of the third electrode pattern including the corner portion 5c can be variously changed. For example, in an exemplary modification illustrated in FIG. 10B, the third electrode pattern 5 includes two corner portions 5d and 5e. That is, in FIG. 10B, the end 3a of the first electrode pattern 3 and the end 4a of the second electrode pattern 4 are opposite each other. Here, the third electrode pattern 5 is connected to the end 4a of the first electrode pattern 4, and includes a first straight portion 5f, a second straight portion 5g, and a third straight portion 5h. The first straight portion 5f extends in a direction substantially perpendicular to an extension line of the first electrode pattern. The second straight portion 5g extends from a corner portion 5d, which is located at one end of the first straight portion 5f, in a direction that is substantially perpendicular to the first straight portion 5f and is spaced away from the first electrode pattern 3. The third straight portion 5h extends from a corner portion 5e located at one end of the second straight portion 5g toward second electrode pattern 4 in a direction substantially perpendicular to the second straight portion 5g. The third straight portion 5h is connected to the end 4a of the second electrode pattern 4. The third straight portion 5h is substantially parallel to the first straight portion 5f and extends in the same direction with respect to the second straight portion 5g. With this configuration, the spread of corrosion caused by moisture intrusion is prevented with certainty.

Figure 10C:
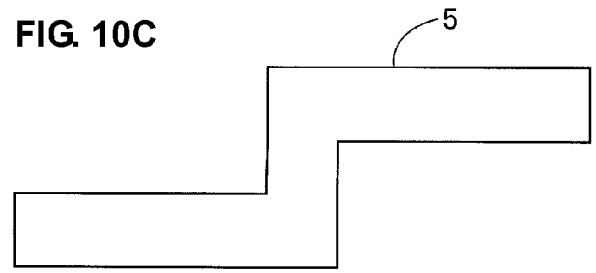
Figure 11:
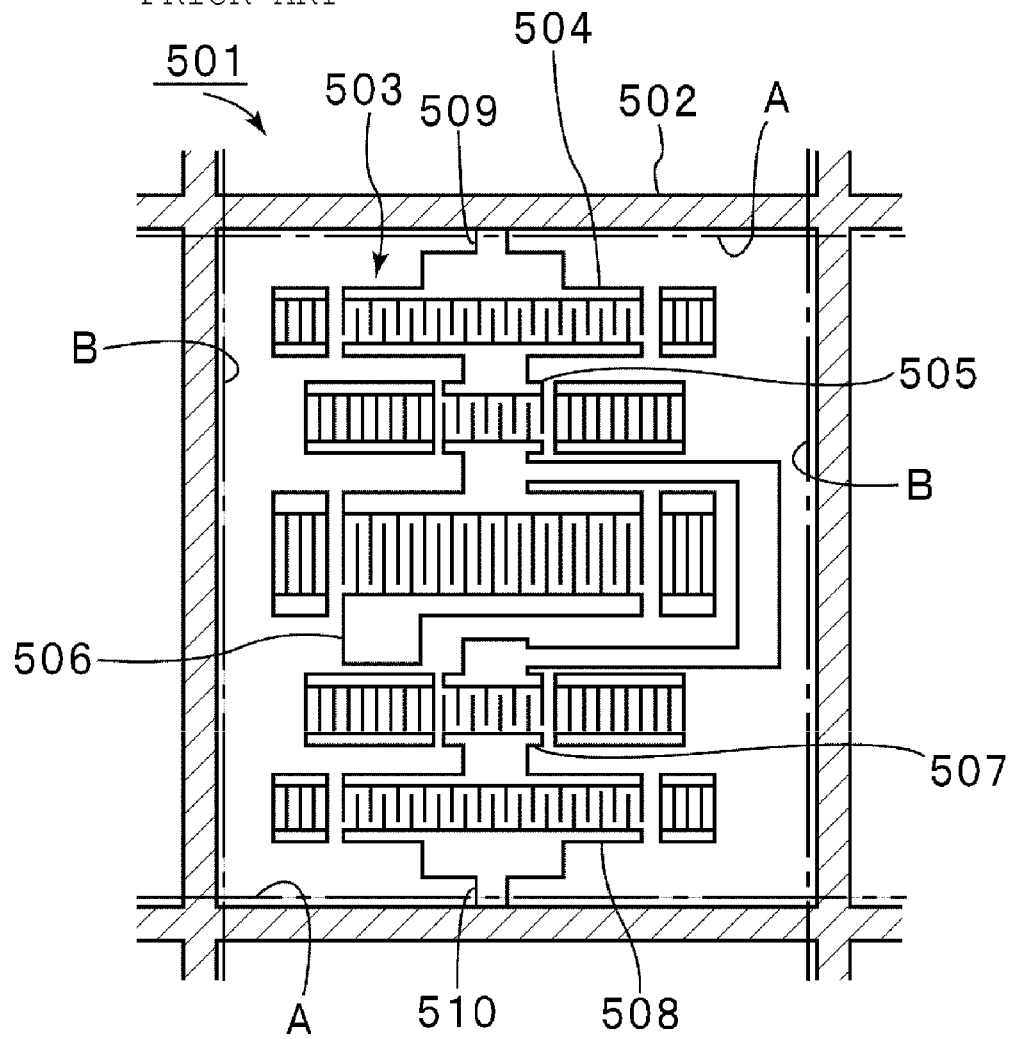
FIG. 11 is a schematic partially-broken enlarged plan view showing a method of measuring the characteristic of a surface acoustic wave filter device in the related art.

The third electrode pattern, including bends that define the above-described corner portions, may have a crank shape as shown in FIG. 10C, which includes a first electrode pattern portion located on an extension line of the first electrode pattern, a second electrode pattern portion located on an extension line of the second electrode pattern that is substantially parallel to and offset from the extension line of the first electrode pattern, and an intermediate portion connecting ends of the first and second electrode pattern portions and extending substantially perpendicular to the first and second electrode pattern portions.

In the above-described preferred embodiment, a surface acoustic wave device is described as an example of an electronic component. However, an electronic component is not limited to a surface acoustic wave device. The present invention may be applied to various electronic components having a configuration in which the first electrode pattern extends to the side of an electronic component and the first main surface of the electronic component, for example, a semiconductor device, a piezoelectric resonator, and a boundary acoustic wave device having an electrode configuration similar to that of a surface acoustic wave device on a boundary surface between a piezoelectric substance and a dielectric substance.

In the above-described preferred embodiments, the lattice-like electrode pattern 21 is preferably used. However, the lattice-like electrode pattern 21 is not required.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. An electronic component comprising:
a substrate including a first main surface and a second main surface opposite to the first main surface, and a side connecting the first and second main surfaces;
a first electrode pattern arranged to extend inwardly from an edge connecting the side and the first main surface of the substrate on the first main surface;
a second electrode pattern arranged opposite to one end of the first electrode pattern through a gap of a predetermined width on the first main surface; and
a third electrode pattern arranged to cover the one end of the first electrode pattern on the side of the gap and one end of the second electrode pattern on the side of the gap and to cross the gap; wherein
the first, second, and third electrode patterns define electrodes on the first main surface of the substrate; and
the third electrode pattern is made of a corrosion-resistant metal film, a corrosion resistance of which is superior to that of metal films from which the first and second electrode patterns are made.

2. The electronic component according to claim 1, wherein the one end of the first electrode pattern on the side of the gap is opposite to the end of the second electrode pattern on the side of the gap through the gap, and the third electrode pattern is substantially straight.

3. The electronic component according to claim 1, wherein the end of the second electrode pattern on the side of the gap is out of alignment with an extension line of the first electrode pattern; and
the third electrode pattern includes an electrode pattern portion disposed on an extension line of the first electrode pattern and a bent corner portion arranged such that the third electrode pattern extends from the electrode pattern portion toward the second electrode pattern.

4. The electronic component according to claim 3, wherein the third electrode pattern has a crank shape including a first electrode pattern portion located on an extension line of the first electrode pattern, a second electrode pattern portion located on an extension line of the second electrode pattern that is substantially parallel to and offset from the extension line of the first electrode pattern, and an intermediate portion connecting ends of the first and second electrode pattern portions and extending substantially perpendicular to the first and second electrode pattern portions.

5. The electronic component according to claim 3, wherein the third electrode pattern includes a first straight portion, a second straight portion, and a third straight portion, the second straight portion being connected to one end of the first straight portion and extending at an angle of about 90° with respect to the first straight portion, the third straight portion being connected to one end of the second straight portion which is opposite to the end of the second straight portion connected to the first straight portion and extending substantially in parallel with the first straight portion, the first and third straight portions being disposed on the same side of the second straight portion.

6. The electronic component according to claim 1, wherein the substrate is a piezoelectric substrate and includes a ground pad connected to the second electrode pattern and an IDT connected to the ground pad, in addition to the first to third electrode patterns so as to define a surface acoustic wave device.

7. The electronic component according to claim 1, wherein each of the first and second electrode patterns includes a single electrode layer made of a material selecting from the group consisting of Cu, Ag, and an alloy of Cu and Ag as a main electrode layer.

8. The electronic component according to claim 1, wherein the third electrode pattern includes an electrode layer made of Al or an Al alloy as a main electrode layer.

9. The electronic component according to claim 1, wherein the electronic component is a surface acoustic wave device.

10. An electronic component manufacturing method comprising the steps of:

preparing a wafer including a mother substrate and an electrode configuration that is formed on one of two main surfaces of the mother substrate arranged to define a plurality of electronic components according to claim 1; and obtaining individual electronic components by cutting the wafer such that, in each of the plurality of electronic components included in the wafer, cutting is performed at an intermediate portion of the first electrode pattern, and the first electrode pattern extends to an edge that is obtained by the cutting and connects the first main surface and the side of the substrate.

11. The electronic component manufacturing method according to claim 10, wherein the electronic component is a surface acoustic wave device.

12. The electronic component manufacturing method according to claim 10, wherein the electrode configuration included in the wafer is a lattice-shaped electrode pattern including a plurality of regions;

a single electronic component is formed in each of the plurality of regions included in the lattice-shaped electrode pattern;

the first electrode pattern is connected to the lattice-shaped electrode pattern; and the wafer is cut such that the cutting is performed at the intermediate portion of the first electrode pattern in each of the regions included in the lattice-shaped electrode pattern.

13. The electronic component manufacturing method according to claim 12, wherein a plurality of IDTs and a plurality of ground pads are formed as electrodes and each of the plurality of ground pads is electrically connected to the second electrode pattern in each of the regions included in the lattice-shaped electrode pattern.

* * * * *